US009966399B2

(12) United States Patent
Stark

(10) Patent No.: US 9,966,399 B2
(45) Date of Patent: May 8, 2018

(54) PIXEL HAVING A PLURALITY OF PINNED PHOTODIODES

(71) Applicant: STMicroelectronics (Research & Development) Limited, Marlow, Buckinghamshire (GB)

(72) Inventor: Laurence Stark, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 55 days.

(21) Appl. No.: 14/972,253

(22) Filed: Dec. 17, 2015

(65) Prior Publication Data

US 2016/0307948 A1 Oct. 20, 2016

(30) Foreign Application Priority Data

Apr. 17, 2015 (GB) .................................. 1506569.1

(51) Int. Cl.

*H01L 27/146* (2006.01)
*H04N 5/374* (2011.01)
*H04N 5/3745* (2011.01)

(52) U.S. Cl.

CPC .... *H01L 27/14614* (2013.01); *H01L 27/1463* (2013.01); *H01L 27/1464* (2013.01); *H01L 27/14641* (2013.01); *H01L 27/14643* (2013.01); *H01L 27/14647* (2013.01); *H04N 5/374* (2013.01); *H04N 5/37457* (2013.01)

(58) Field of Classification Search

CPC ......... H01L 27/14614; H01L 27/14643; H01L 27/14636; H01L 27/1463; H01L 27/14632; H01L 5/23241; H01L 5/335; H01L 5/23293

See application file for complete search history.

(56) References Cited

U.S. PATENT DOCUMENTS

2006/0043440 A1* 3/2006 Hiyama ............ H01L 27/14603 257/291
2013/0175582 A1* 7/2013 Ihara .................. H01L 27/1461 257/222
2013/0248938 A1 9/2013 Buettgen et al.

FOREIGN PATENT DOCUMENTS

WO WO-2015006008 A1 1/2015

OTHER PUBLICATIONS

EPO Search Report for EP15202569 dated Jul. 18, 2016 (11 pages).
Ma, Jiaju et al: "A Pump-Gate Jot Device With High Conversion Gain for a Quanta Image Sensor," IEEE Journal of the Electron Devices Society, IEEE, USA, vol. 3. No. 2, Mar. 1, 2015, pp. 73-77, XP011573690, DOI: 10.1109/JEDS.2015.2390491 (Retrieved on Feb. 20, 2015), *the whole document*.
Michelot, J.: "Black Illuminated Vertically Pinned Photodiode With in Depth Charge Storage," Jan. 1, 2011, XP055288887, Retrieved from the internet: URL:http//www.imagesensors.org/Past%20Workshops//2011%Workshop/2011%20Papers/R09_Michelot_VerticalPPD.pdf, (retrieved on Jul. 15, 2016), *the whole document*.

* cited by examiner

*Primary Examiner* — Twyler Haskins
*Assistant Examiner* — Fayez Bhuiyan
(74) *Attorney, Agent, or Firm* — Crowe & Dunlevy

(57) ABSTRACT

A pixel is formed by two or more photodiodes and at least one transfer gate. The transfer gate is configured to transfer charge from each of the photodiodes to a common sense node, such that charge from the photodiodes is combined at the common sense node.

37 Claims, 15 Drawing Sheets

82
S T I
N+
84
78
80
N+
S T I
C D T I
N+
76
74
P-
Type 86
P
N- well
P
N- well
P
N- well
70
72
14

Transfer Gate 122
Floating Diffusion 124
Photodiode 120
Source Follower Transistor 126
104
106
108
110
100
P-Type 16
14
P+
N-Well
N+
P
STI Photodiode 120
Transfer Gate 122
Floating Diffusion 124
Transfer Gate 122
Photodiode 120
Photodiode 120
Transfer Gate 122
Floating Diffusion 124
Transfer Gate 122
Photodiode 120
Source Follower Transistor 126
108
100
110
104
102
N-Well
P+
P
N+
STI
P-Type 16
14

PIXEL HAVING A PLURALITY OF PINNED PHOTODIODES

PRIORITY CLAIM

This application claims priority from Great Britain Application for Patent No. 1506569.1 filed Apr. 17, 2015, the disclosure of which is incorporated by reference.

TECHNICAL FIELD

Some embodiments relate to a pixel having a plurality of pinned photodiodes.

BACKGROUND

Image sensors using pinned photodiode pixels, typically implemented in CMOS architecture, are known. Such image sensors have many applications. In some applications, an array of pixels may be provided.

SUMMARY

According to an aspect, there is provided a pixel comprising: a plurality of pinned photodiodes; and at least one transfer gate, the or each transfer gate being configured such that in use charge is transferred from each of said plurality of pinned photodiodes to a common sense node, such that charge from said plurality of pinned photodiodes is combined at said common sense node.

A single transfer gate may be provided.

The single transfer gate may overlie each of the pinned photodiodes.

A respective transfer gate may be provided for each pinned photodiode.

Each of said transfer gates may be configured to be controlled by a common transfer gate signal.

The pixel may comprise a floating diffusion implant for each of said plurality of pinned photodiodes.

The pixel may comprise a single floating diffusion implant.

A floating diffusion implant may be provided in a region between two of said pinned photodiodes.

A floating diffusion implant may be provided on one side of one of said pinned photodiodes remote from another of said pinned photodiodes.

The pinned photodiode may be defined by a well of a first conductivity type provided in a substrate of a second, different conductivity type. The floating diffusion implant may be of the first conductivity type.

The pixel may comprise a source follower transistor and wherein the or each floating diffusion implant may be provided with a contact, a gate of said source follower transistor being provided with a contact, said contacts each being in contact with a common metal part.

A first gate is provided which overlies the pinned photodiodes and the transfer gate may be provided adjacent said first gate.

In use, during integration, the first gate may be at a relatively high voltage and said transfer gate may be at a relatively low voltage.

Each of said pinned photodiodes may comprise a vertical pinned photodiode.

Each of said pinned photodiodes may comprise a lateral pinned photodiode.

Each of said pinned photodiodes may be horizontally oriented.

The horizontally oriented pinned photodiodes may be separated by respective pinning layers.

Deep trench isolation may be provided around the pixel.

An array of pixels, such as described previously may be provided.

The array of pixels may be provided in an electronic device. The electronic device may also have at least one processor for processing data captured by the array of pixels. The processed data may be displayed on a display and/or sent to a remote device.

BRIEF DESCRIPTION OF THE DRAWINGS

Reference is now made by way of example only to the accompanying drawings in which.

DETAILED DESCRIPTION

Figure 1:
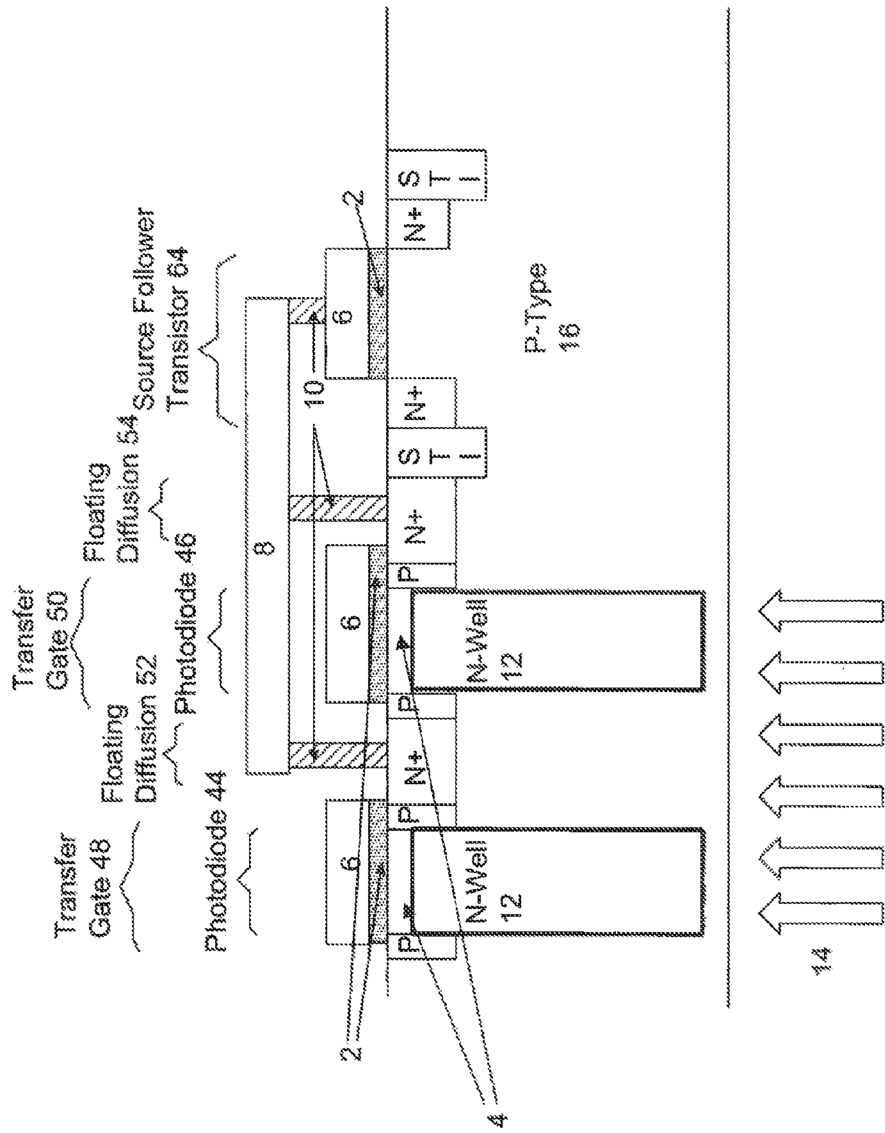
FIG. 1 shows a cross-section of a pixel of a first embodiment.

Global shutter pixels may have more transistors than rolling blade pixels and so may be larger. As far as rolling blade pixels are concerned, there may be a benefit of larger pixels for rolling blade pixels as they can collect more light.

If a rolling blade shutter arrangement is used, pixels are processed line by line, one being integrated and another being read out for each movement of the shutter. The shutter moves over the array so that all the pixels are exposed for the same amount of time, but not all at the same time.

If a global shutter arrangement is used, all pixels are simultaneously released from reset and start to integrate simultaneously. After a specific period, all the pixels are then read out simultaneously into a temporary storage, which may be located inside the pixel. This temporary storage is then scanned out row by row where the signal is amplified or converted into a digital value.

The amount of charge that a pinned photodiode can collect before saturating is known as the full-well. It is desirable to have a large full-well so that many photons can be collected from the incoming illumination and the imaging range extended. Using a vertical pinned photodiode configuration provides "in-depth" charge storage which can be used to maximize the full-well capacity for a given pixel area by increasing the extent of the well into the silicon substrate. This is particularly advantageous, for example, for small pixels. A vertical pinned photodiode configuration allows an increase in the full-well capacity without the associated increase the pixel's 2D footprint. The vertical pinned photodiode structure may provide an improved quantum efficiency QE for the pixel, since the pinned photodiode may cover most of the depth of the silicon from the front side to back side. Quantum efficiency is the ratio between the number of photons incident on the pixel and the number of electrons collected. QE=Number of electrons/Number of photons.

The depletion potential of a vertical pinned photodiode structure is influenced by the smallest dimension of the diode, which may prevent that structure from being used in larger pixels. For some pixels, such as the 4T pixel, planar pinned photodiodes are used to address this problem. However, these pixels may have a shallow junction depth which may lead to a reduced QE. Typically a planar photodiode has a reduced storage capacity per unit area compared to the vertical pinned photodiode.

The inventors have recognized that to improve image quality, it may be desirable that the depletion potential of a pinned photodiode be kept as low as possible and the full-well capacity should be as high as possible. This may be achieved in a larger pixel by stacking several planar pinned photodiodes. This may also maximize the dynamic range of the pixel.

The photon shot noise (PSN) in electrons, is equal to the square-root of the number of electrons collected. Hence the maximum signal-noise ratio (SNR)=SQRT(full-well electrons). Consequently, reducing the maximum full-well electrons reduces the maximum SNR resulting in an image with greater noise.

It may in some embodiments be advantageous to increase the size of the pinned photodiode without an increase in the depletion potential in order to keep the full-well capacity of the pinned photodiode large and the maximum SNR large.

Some embodiments will now be described. In some embodiments, vertical pinned photodiodes may be used. In some embodiments, lateral pinned photodiodes may be used.

Reference is made to FIG. 1 which shows a cross section of a first embodiment. The arrangement of FIG. 1 shows a back-side illumination (BSI) pixel. For BSI pixels, the photons impact the silicon on the opposite side to the diode implants. The pinned photodiode may be implanted deeper so it is close to where the photons impinge on the silicon surface. This type of pinned photodiode is called a "Vertical Pinned Photodiode".

BSI technology was developed to enable the manufacture of small, light-sensitive pixels as the transistors and metal wires do not obstruct the photons. As shown in FIG. 1, the transfer gate is largely on top of the pinned photodiode.

Light 14 impinges on a first N-well 12 and a second N-well 12 in a P-type silicon substrate 16. Each of the N-wells acts as a pinned photodiode 44 and 46, respectively. The photo generated charge from the N-wells is transferred into respective floating diffusion implants 52 and 54 and the capacitance of the floating diffusion implants is used to turn the photo-charge into a voltage. The floating diffusion implant is formed by an N+ implant adjacent the respective well. Contacts 10 are provided between the respective N+ implant and a metal layer 8.

Above each N-Well is a respective pinning layer 4. This isolates the N-Well from the front surface of the silicon as the front surface of the silicon may be damaged during manufacture of the device by the various implants. Separating the N-Well from the front surface may reduce the dark current, i.e. electrons which are thermally generated without any light. On either side of each of the pinning layers is a P region. The N+ implant between the two wells has a P region on either side thereof. The other N+ implant has a P region on the side closer to the N-well and a shallow trench isolation STI region on the side further from the N-well.

Each N-Well is reset and read out using a respective transfer gate 48 and 50. Each transfer gate is provided by a gate oxide 2 in contact with the respective pinning layer 4 and a polysilicon layer 6 above the gate oxide. The transfer gate also overlies the P region and part of the N+ implant on one side of the well and part of the P region on the other side of the N-well.

Also shown in FIG. 1 is a source follower transistor 64 which has a gate formed by a gate oxide layer 2 overlying the P-type silicon substrate. On each side of the portion of the P-type silicon substrate under the gate oxide is an N+ implant. The N+ implant closer to the N-wells is next to the STI region mentioned above. A further STI region is provided on the other side of the N+ implant further from the N-wells. A polysilicon layer 6 is provided above the gate oxide on which is provided a contact 10, again providing contact with the metal layer 8.

Figure 3:
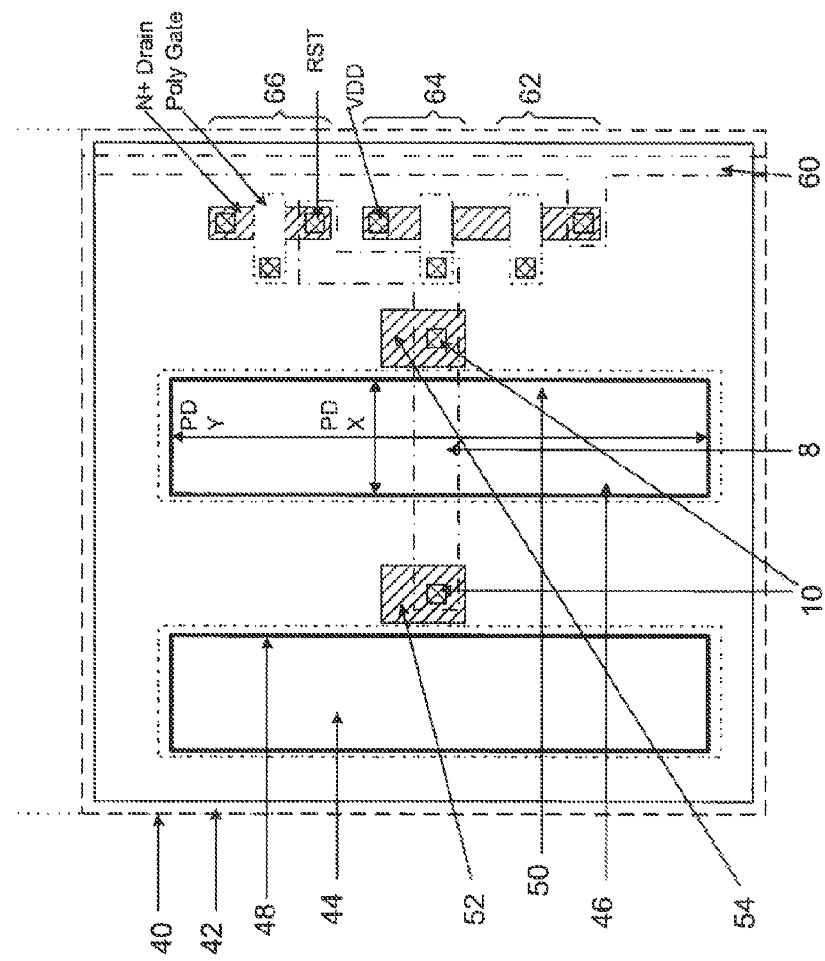
FIG. 3 shows a plan view of the pixel of FIG. 1.

Reference is made to FIG. 3 which shows a plan view of the embodiment of FIG. 1. Those parts which are the same as in FIG. 1 are referenced using the same reference number. The plan view shows the first and second diodes 44 and 46. Each pinned photodiode has a width PDX and a length PDY. (FIG. 1 shows the depth of the pinned photodiode). The transfer gates 48 and 50 above the respective pinned photodiode is shown in dotted lines. The dotted lines 40 around the pixel show the pixel pitch which can be any suitable size depending on the used process technology. By way of example only, the pixel pitch may be of the order of 2-5 μm.

In some embodiments, DTI (deep trench isolation) 42 may be provided around each pixel, but for clarity, this is not shown in FIG. 1 but is shown in FIG. 3. It is possible that charge which is generated in one pixel diffuses across to a neighboring pixels. This produces crosstalk and is especially problematic on a color sensor where typically the neighboring pixel has a different color filter. It should be appreciated that in contrast to known arrangements, the pixel of some embodiments has two or more N-wells.

The floating diffusion part 52 associated with the first pinned photodiode is shown within the region of the transfer gate 48 and the floating diffusion part 54 associated with the second pinned photodiode is shown within the region of the transfer gate 50. The metal layer 8 is shown which extends between the contacts of the floating diffusion implants and the gate of the source follower transistor 64.

Various electronics are required to control the reading and resetting of the pixel and they are provided in an edge region of the pixel adjacent a metal bit line VX which is referenced 60. These electronics may be provided in a region parallel to the y axes of each of the N-wells. The electronics may comprise a reset transistor 66, the source follower transistor 64 and a read transistor 62.

Figure 4:
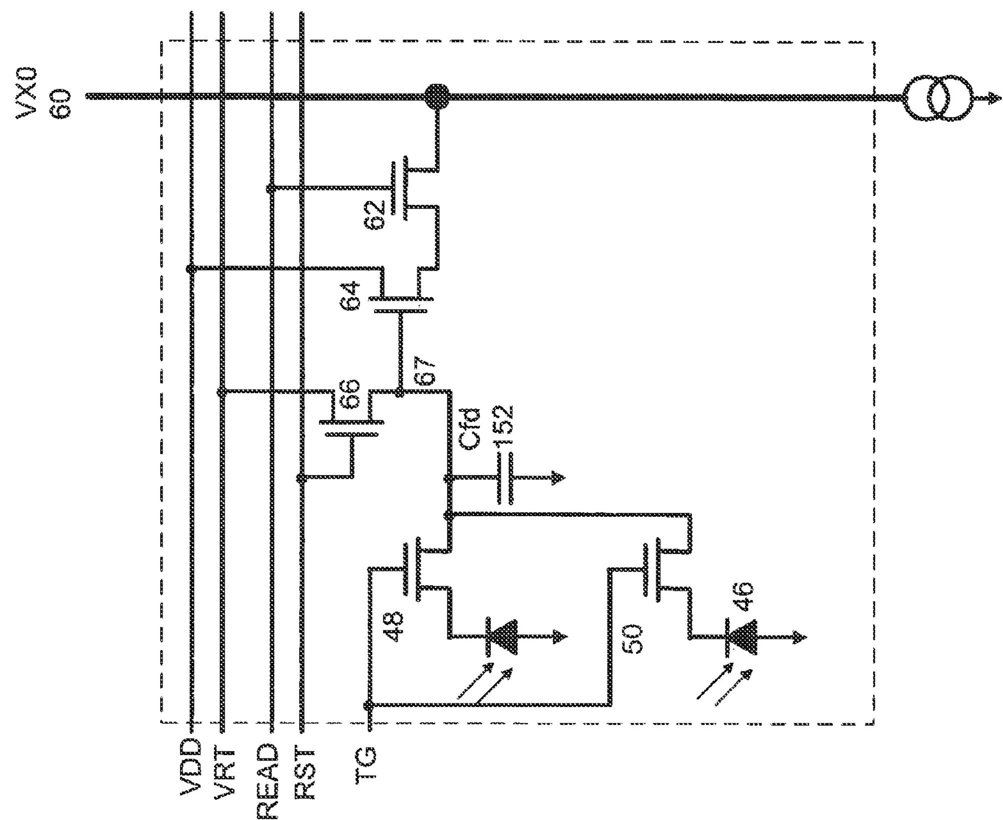
FIG. 4 shows a circuit showing a pixel of an embodiment.

Reference is made to FIG. 4 which schematically shows pixel circuitry in which embodiments may be provided. The pixel comprises the two pinned photodiodes 44 and 46, the respective transfer gate 48 and 50 associated with each pinned photodiode, the source follower transistor 64, the reset transistor 66 and the read transistor 62. These transistors act to reset, expose and then read out data from the pinned photodiodes. The transfer gate transistors are controlled by a signal TG, the reset transistor 66 is controlled by a signal RST and the readout transistor 62 is controlled by the read signal READ. The source follower transistor has its gate tied to a sense node 67.

In more detail, the reset transistor 66 receives the reset signal RST at its gate, its drain is connected to a voltage VRT and its source is connected to the sense node 67. The source follower transistor 64 has its drain connected to a source follower supply voltage VDD and its source connected to the drain of the read transistor 62. The read signal READ is coupled to the gate of the read transistor 62. The source of the read transistor 62 provides the output voltage Vx. The transfer gate transistors 48 and 50 have their gates coupled to the control signal TG. The drains of the transfer gate transistors are connected to the sense node 67 whilst their sources are connected to the pinned photodiodes.

The transistors typically operate with a pinned photodiode structure and Correlated Double Sampling (CDS) to remove "kTC" noise associated with the reset operation. In Correlated Double Sampling, the output of the pixel is measured twice: once in a reset condition (in this case at "black level" when the only level change is resultant from noise) and once in a condition including the signal (which still includes the "black level" noise). The value measured from the signal condition is then subtracted from the reset condition so as to remove the "black level" noise offset. The double sampling operation also removes fixed noise sources such as variation in the threshold voltages of the source follower transistors.

The pixel needs to have appropriate voltage levels applied at defined time intervals. The voltage levels of the control signal TG (to transfer the pixel signal level to the sense node), RESET (to reset the sense node and pinned photodiodes) and READ (to select the pixel to the Vx line) as well as the pixel power supply (providing VRT and VDD) are controlled.

The charge from the two pinned photodiodes are combined at the sense node 67 are read out at the same time. A capacitance 152 is shown to schematically represent the capacitance of the pinned photodiode.

A discussion of the arrangement of FIG. 1 as compared to a current pixel technology will be discussed. In a known pixel, there is only a single N-well for each pixel. For some applications, it may be desirable to have as many pixels on the sensor as possible. For portable devices, the size of a camera module (including the lens) may need to be as small as practical, hence the pixels need to be as small. By way of example only, 0.9 μm, 1.1 μm or 1.4 μm are typical pixel pitches (for both x and y dimensions).

Smaller pixels may produce a sensor which has a relatively poor response to low light levels and/or lower signal-noise ratio. Thus, it may be desirable to increase the size of a pixel. However, the inventors have appreciated that simply increasing the size of the N-Well pinned photodiode may be disadvantageous in some applications as the pinning potential may be undesirably increased. The depletion potential can be determined by solution of Poisson's equation:

$$\nabla^2 \varphi(x, y, z) = \frac{\rho_f(x, y, z)}{\varepsilon}$$

Where $\varphi$ is the electrostatic potential, $\rho_f$ is the charge density distribution and $\epsilon$ is the permittivity of the medium (in this case, silicon). The depletion potential is defined as the maximum value of the electrostatic potential inside of the photodiode at full depletion. As the charge density distribution is a function of the dimensions of the photodiode, the depletion potential is dependent upon the geometry of the photodiode. The depletion potential solution may be dominated by the smallest dimension of the photodiode, and for this reason, pinned photodiodes will usually have one dimension which is considerably narrower than the others. This dimension is often referred to as the "pinning" dimension. For a typical photodiode, the pinning dimension is the Z axis, where Z represents the depth into the silicon. This may be described as a planar photodiode. In the present disclosure, the pinning dimension is in either the X or Y axes. This may be known as a vertical pinned photodiode. An increased diode depletion potential reduces the usable voltage swing at the floating diffusion and may reduce the dynamic range and maximum signal-to-noise ratio of the pixel.

Thus, in the embodiment of FIGS. 1, 3 and 4, a single photodiode is replaced by a plurality of vertical pinned photodiode 'fins'. Typically, each of these fins share the same pinning dimension size (PDX in FIG. 3). The size may be the same as found in smaller (<2.0 μm) pixels. The pinning dimension for example, may be less than 0.3 μm, less than 0.5 μm, less than 1 μm, less than 10 μm or less than 50 μm. Alternatively, the lateral pinning dimension (PDX) may be represented by a percentage of another dimension of the photodiode, such as the other lateral dimension PDY, or the depth into the substrate PDZ. The pinning dimension PDX may be for example, less than 15% of PDY, less than 30% of PDY, less than 50% of PDY, less than 15% of PDZ or less than 30% of PDZ. This may keep the depletion potential approximately equal to that of the smaller pixels. Preferably, the size of each of the pinned photodiodes are the substantially the same. Each pinned photodiode has its own transfer gate and floating diffusion.

These floating diffusion implants in the embodiment shown in FIGS. 1 and 3 would be connected in parallel and to the gate of the source follower.

Figure 2:
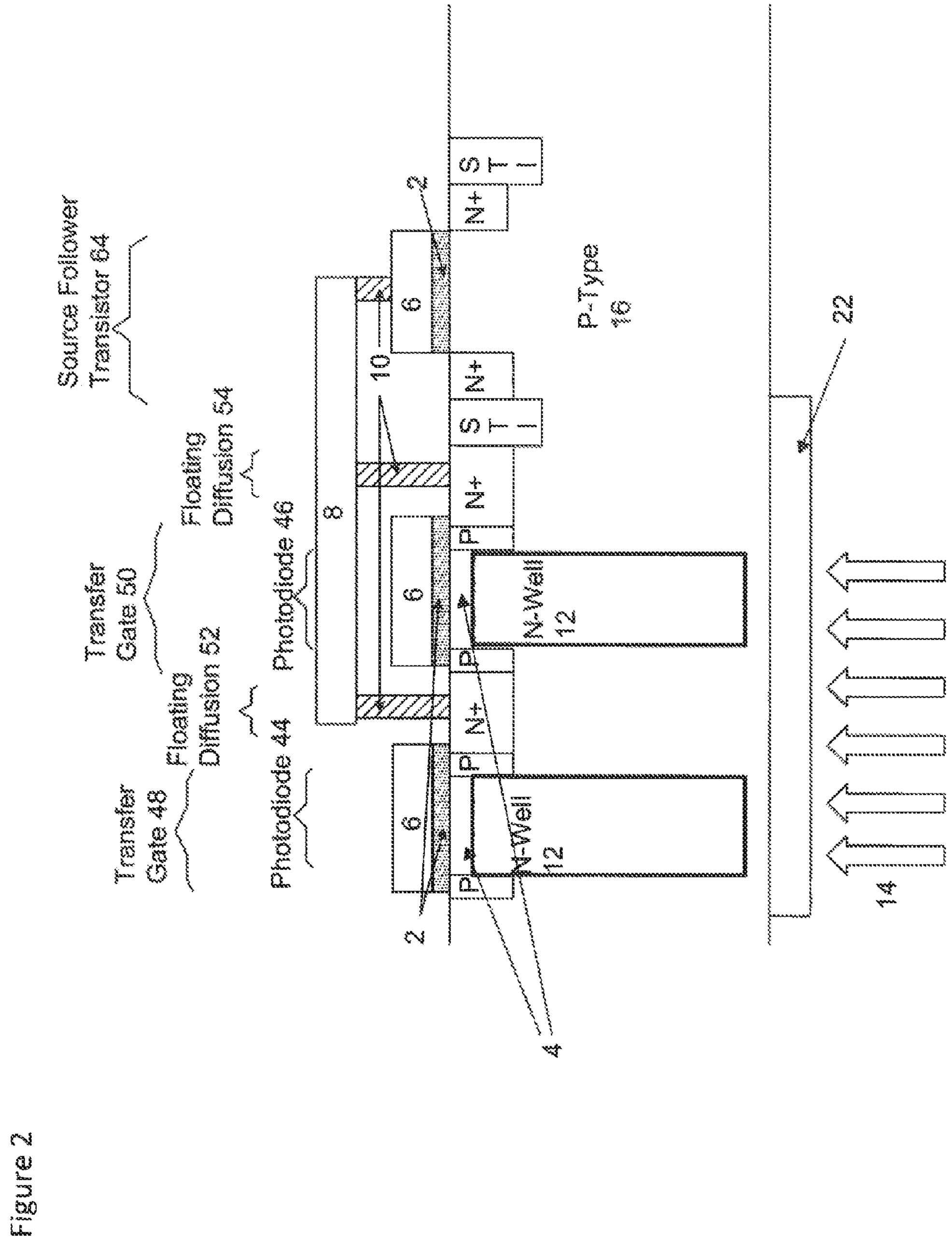
FIG. 2 shows a cross-section of the embodiment of FIG. 1 with a color filter.

Reference is made to FIG. 2 which shows a modification to the embodiment shown in FIG. 1. In this embodiment, a color filter is provided between the light source and the P-type substrate. An array of pixels may be provided with different color filters, such as red, blue and green. This is allows a color image to be captured. The arrangement of FIG. 1, without any color filter, may be used to capture a monochrome image.

Figure 5:
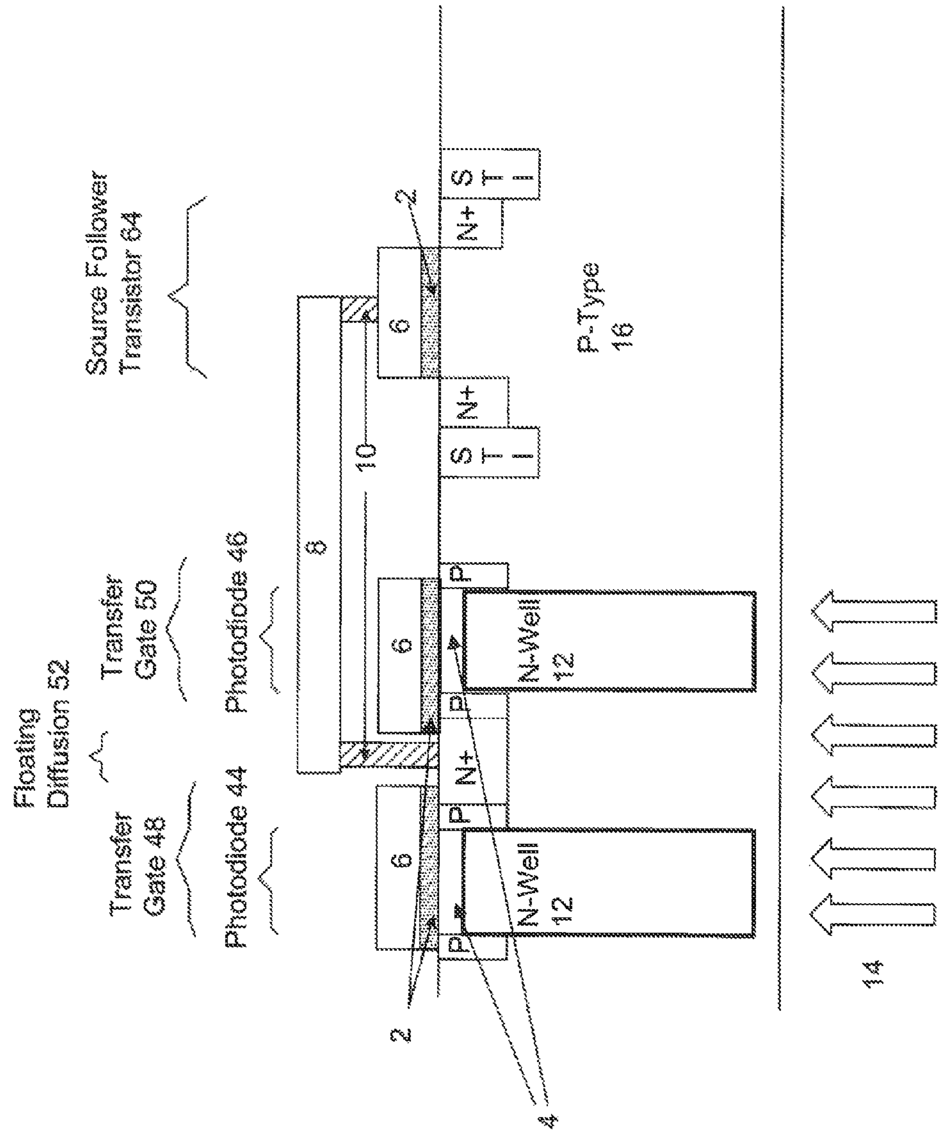
FIG. 5 shows a cross-section of a pixel of a further embodiment with a shared floating diffusion implant.

Reference is made to FIG. 5 which shows another embodiment. Those parts which are the same as in FIG. 1 are referenced by the same reference numeral. In FIG. 5, there is a single floating diffusion implant 52 which is shared by both pinned photodiodes. In other words, there is a single N+ implant provided between the two N-wells. This N+ region is located as discussed in relation to FIG. 1.

This arrangement may be advantageous where it is desirable to reduce the size of the floating diffusion implant to reduce the capacitance of this node. With the reduced capacitance the conversion gain may be improved. The conversion gain is defined as the reduction in voltage for each electron added to the floating diffusion implant and the customary units are μV/electron.

An improvement in the conversion gain has one or more of the following advantages: each photo-generated charge collected will produce a larger voltage swing at the output of the pixel, hence any noise elsewhere in the system has a smaller effect; and the equivalent input referred noise will be decreased as noise in the system is multiplied by the conversion gain to convert from voltage to charge or electrons.

In the arrangement of FIG. 5, photo-generated charge which is collected by pinned photodiode 44 needs to be transferred to the floating diffusion in one direction (on the right in the Figure) while the photo-generated charge collected by the pinned photodiode 46 needs to be transferred in the opposite direction (to the left in the Figure). During manufacture of the device, there may be a doping profile in the transfer gate which helps to move the charge in the appropriate direction. In the arrangement shown in FIG. 5, different doping profiles may be provided for the two different transfer gates, because the transfers are in different directions. This could be involve the use of separate masks and implant steps for the different transfer gates.

Figure 6:
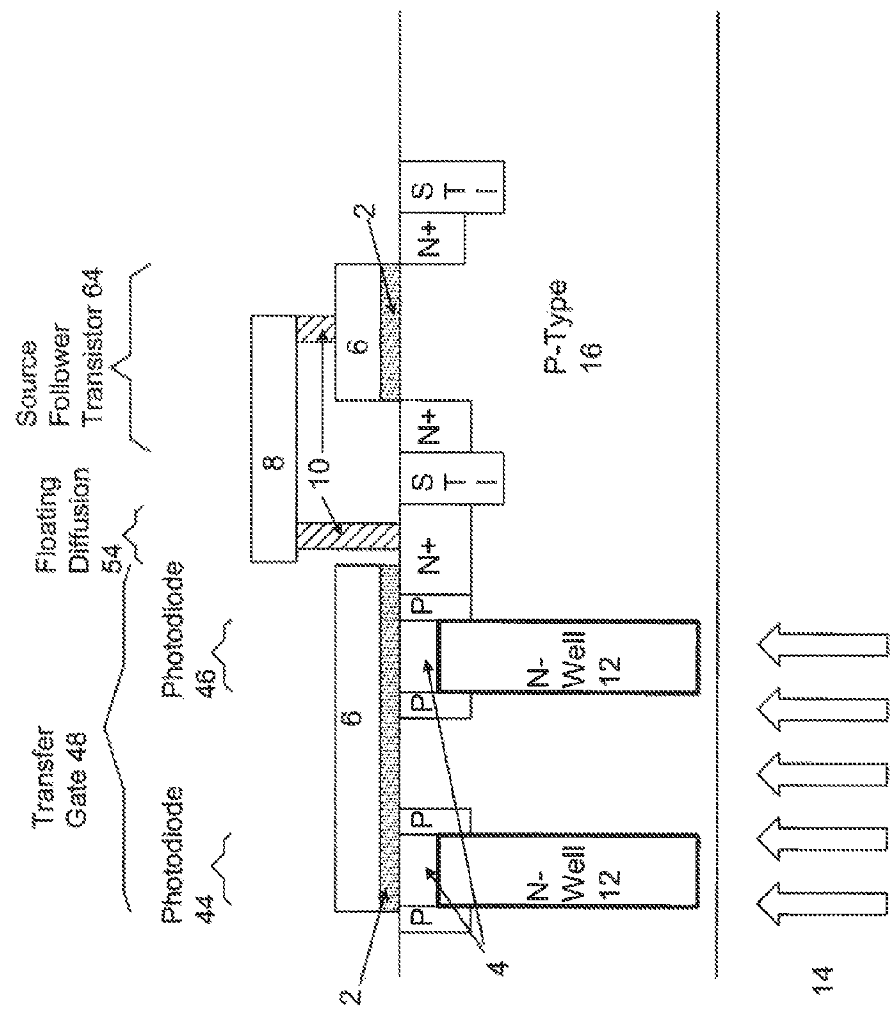
FIG. 6 shows a cross-section of a pixel of a further embodiment with a shared transfer gate.

Reference is made to FIG. 6 which shows another embodiment. Those parts which are the same as in FIG. 1 are referenced by the same reference numeral. FIG. 6 shows an embodiment where the two diode fins are provided under a single transfer gate. This embodiment may allow a large full-well capacity to be obtained and to have a good floating diffusion conversion gain. In this embodiment, there is a single transfer gate which extends across both of the N-wells and the gap therebetween. No N+ implant is provided between the N-wells, this region now being the P-type substrate. The N+ implant is provided on the side of the second pinned photodiode 46 remote from the first pinned photodiode 44. The contacts 10 provide contact respectively between the N+ implant and the metal layer 8 and between the source follower transistor 64 and the metal layer.

Figure 7:
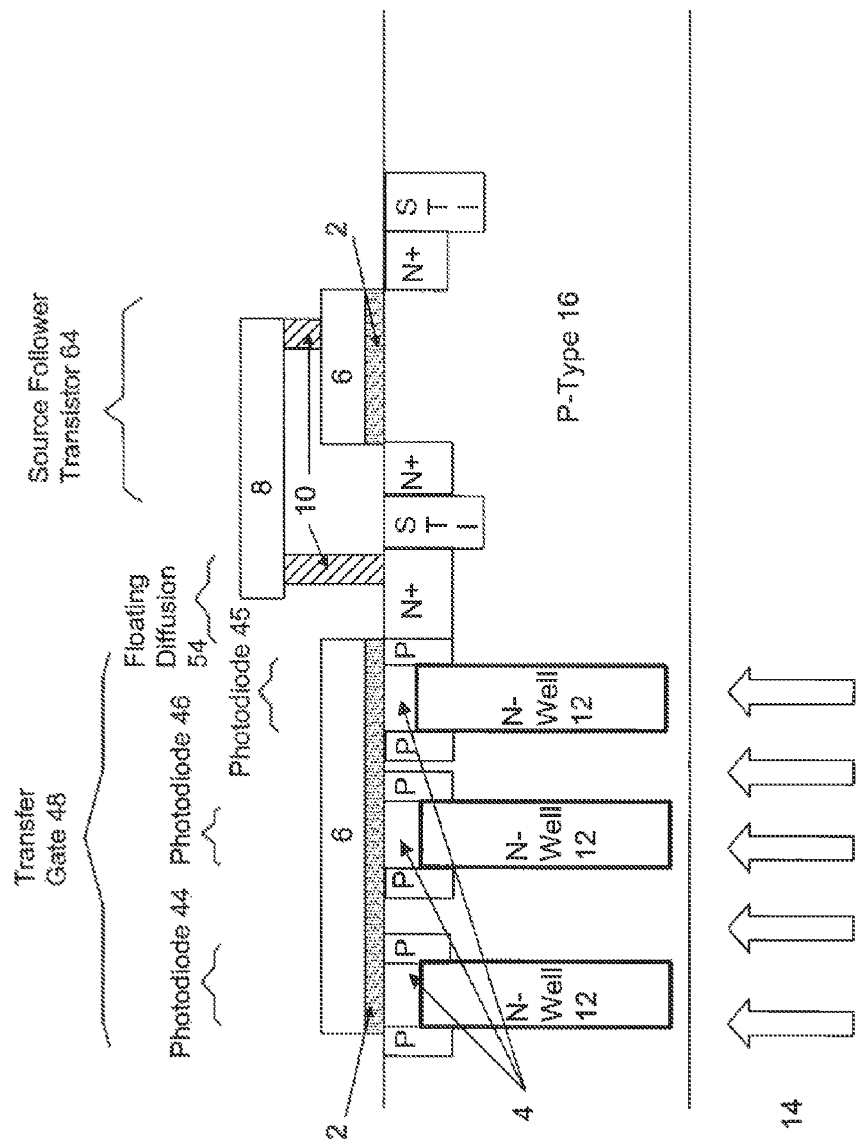
FIG. 7 shows a cross-section of a pixel of a further embodiment with three pinned photodiodes and a shared transfer gate.

Reference is made to FIG. 7 which shows another embodiment. Those parts which are the same as in FIG. 1 are referenced by the same reference numeral. FIG. 7 shows an embodiment similar to that of FIG. 6 but where three N-wells 12 are provided. A further photodiode 45 is thus provided. The three N-wells are provided under a single transfer gate.

It should be appreciated that embodiments may have any suitable number of pinned photodiodes. In this example, the pinned photodiode fins are provided under a single transfer gate. The number of pinned photodiodes provided may be determined by the size of the fins and pixel. Each additional pinned photodiode may increase the total full-well capacity without increasing the depletion potential.

Figure 8:
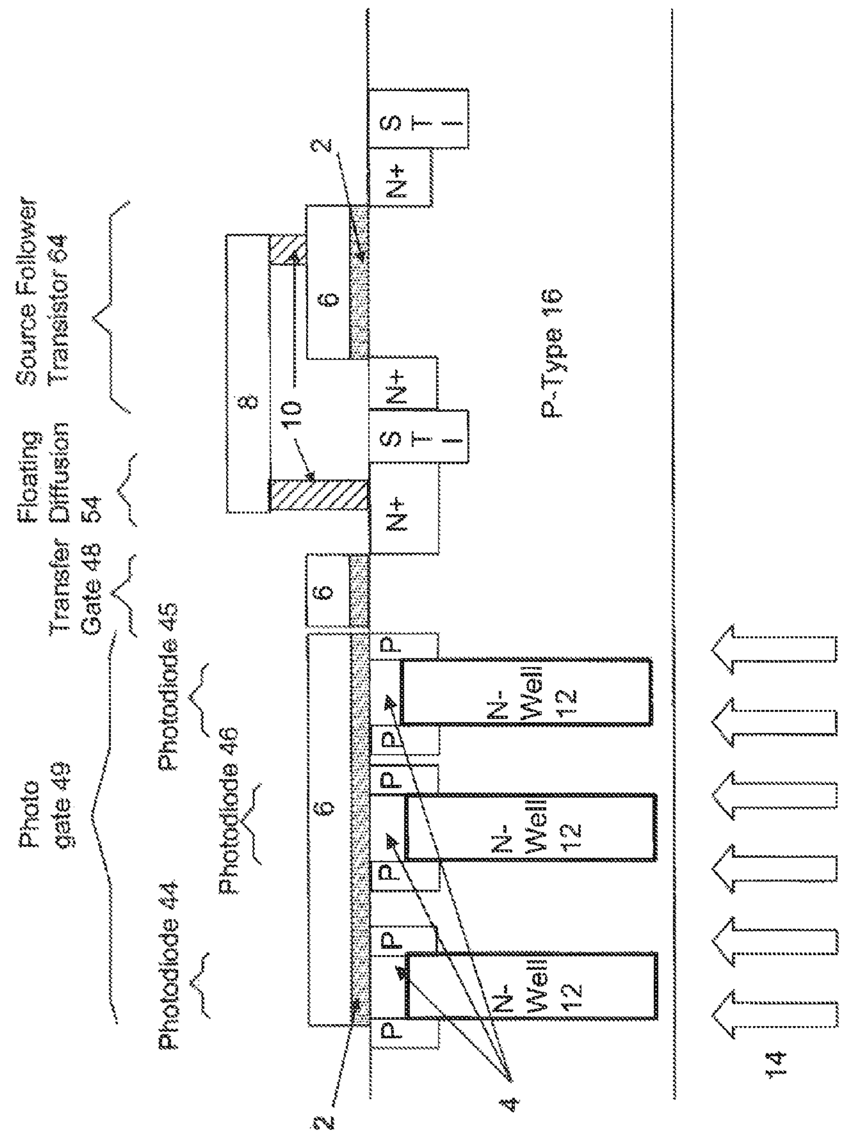
FIG. 8 shows a cross-section of a pixel of a further embodiment with three pinned photodiodes having a two-stage charge transfer.

Reference is made to FIG. 8 which shows another embodiment. Those parts which are the same as in FIG. 7 are referenced by the same reference numerals. FIG. 8 shows an embodiment where there is a polysilicon electrode 49 (a so-called photo-gate) above the all of the pinned photodiodes (three in this example) and a transfer gate 49 next to the photo-gate. The transfer gate 48 is between the photo-gate and the N+ implant. The transfer gate overlies the P-type substrate. For conventional operation, both photo-gate and transfer gate are pulsed high at the appropriate time and the charge transfer occurs in the normal manner. During the integration period, if the transfer gate is at a low voltage and the photo-gate is driven to a sufficiently high voltage, the substrate underneath the photo-gate will enter deep-depletion and accumulate charge (i.e. it will operate as a CCD). Once the gate voltage has been sufficiently screened by the collected charge, the pinned photodiodes will begin collecting charge as normal. Operating in this mode may yield a full-well capacity boost. This may boost pixel performance, for example in relative high light conditions.

Figure 9B:
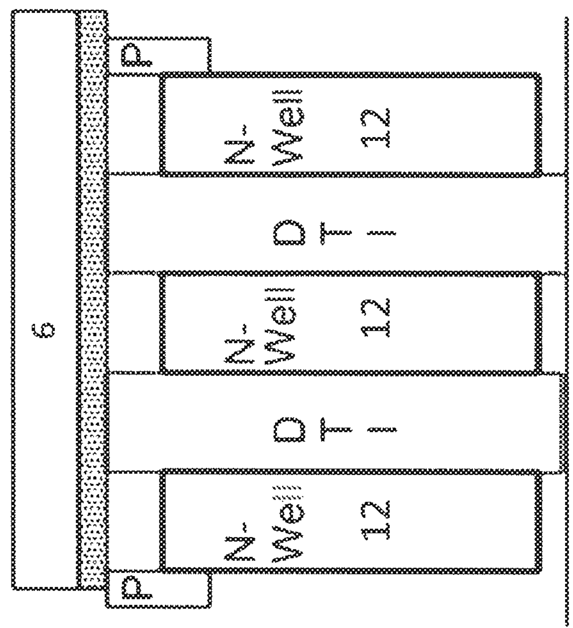
FIG. 9*b* shows a method for forming a diode structure of some embodiments using deep trench isolation.
Figure 9A:
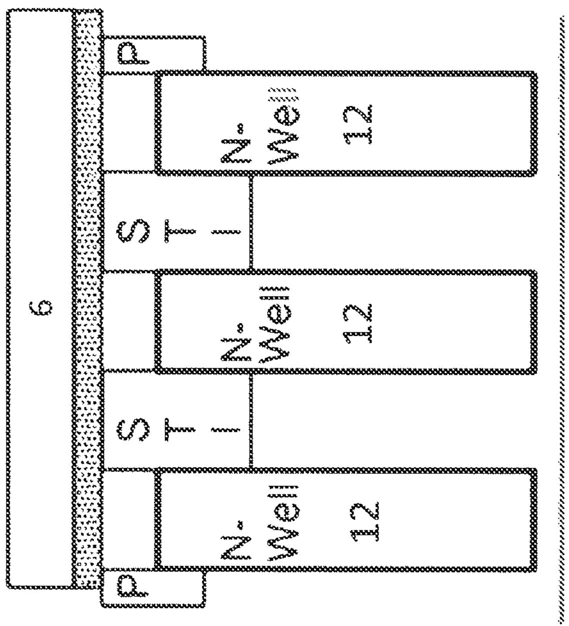
FIG. 9*a* shows a method for forming a diode structure of some embodiments using shallow trench isolation.

FIGS. 9*a* and 9*b* schematically show two methods of creating the structures described previously. FIG. 9*a* shows the use of shallow trench isolation (STI) to mask the diode implants. This may ensure that the storage regions will be reliably formed. FIG. 9*b* shows the use of deep trench isolation (DTI) is used, which extends further into the silicon than STI. In some cases, the silicon wafer may be thinned down such that the DTI extends through the entire silicon depth.

Figure 10:
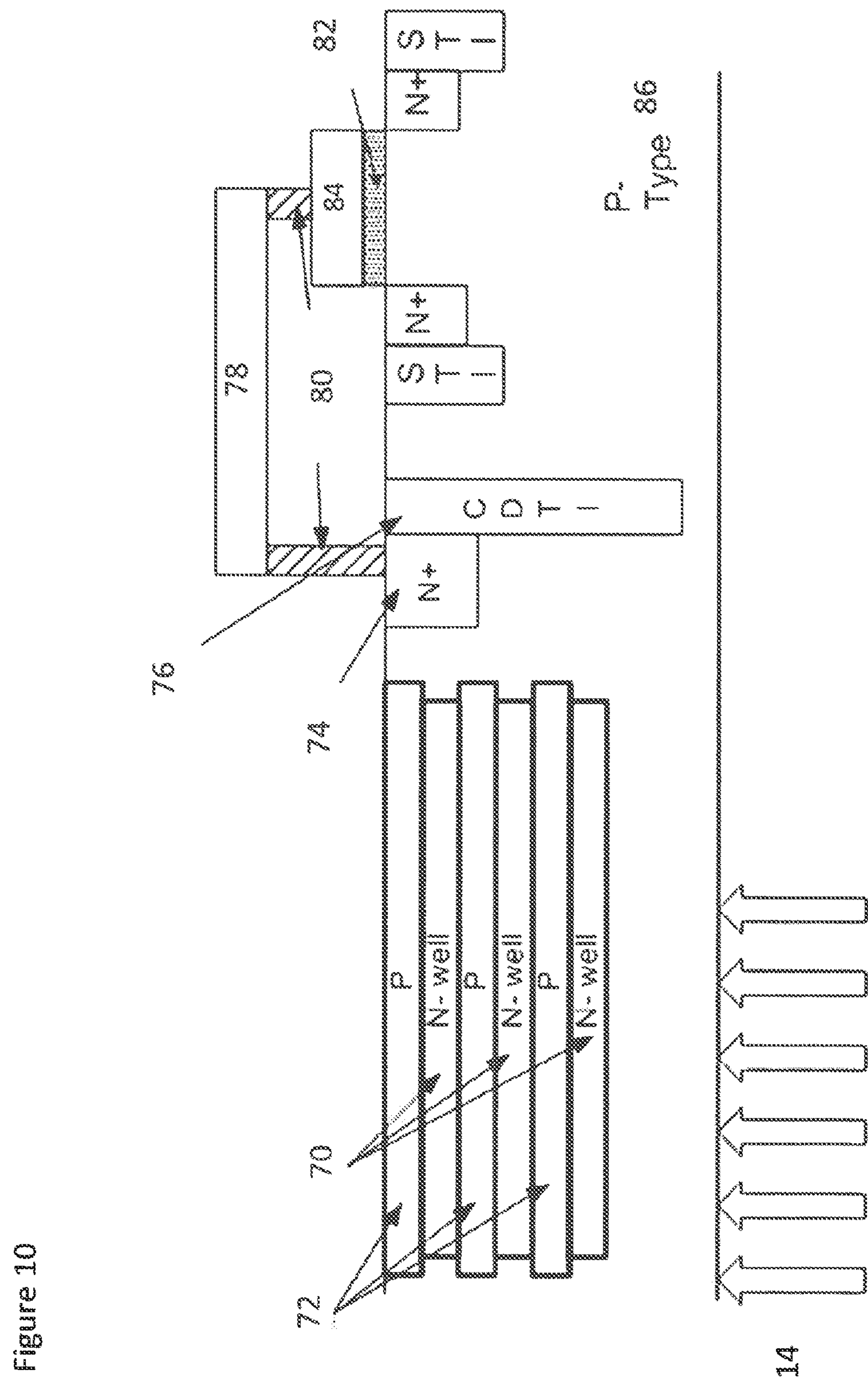
FIG. 10 shows another embodiment of a pixel with horizontally oriented fins and a vertical transfer gate.

FIG. 10 shows an embodiment with two or more horizontally-oriented N-Well fins. The N-Well fins 70 are interlaced with pinning layers 72. The number of fins may be any suitable number and the example shown in FIG. 10, 2 fins are provided. A vertical transfer gate 76 is provided. The vertical transfer gate 7 may be created with capacitive deep trench isolation (CDTI). This pixel may operates in a similar manner as that described relation to FIG. 7. In particular, the transfer gate 76 and floating diffusion implant may be as shown in FIG. 7. In this embodiment, the CDTI is provided next to the N+ implant region with the P-type substrate between the CDTI and the STI.

The pixel of FIG. 10 is a BSI pixel. This pixel may be suitable for FSI process technology.

A number of the discussed embodiments have been vertical pinned photodiodes with transfer gates on top of the photodiode. Other embodiments may use lateral pinned photodiodes.

Figure 11:
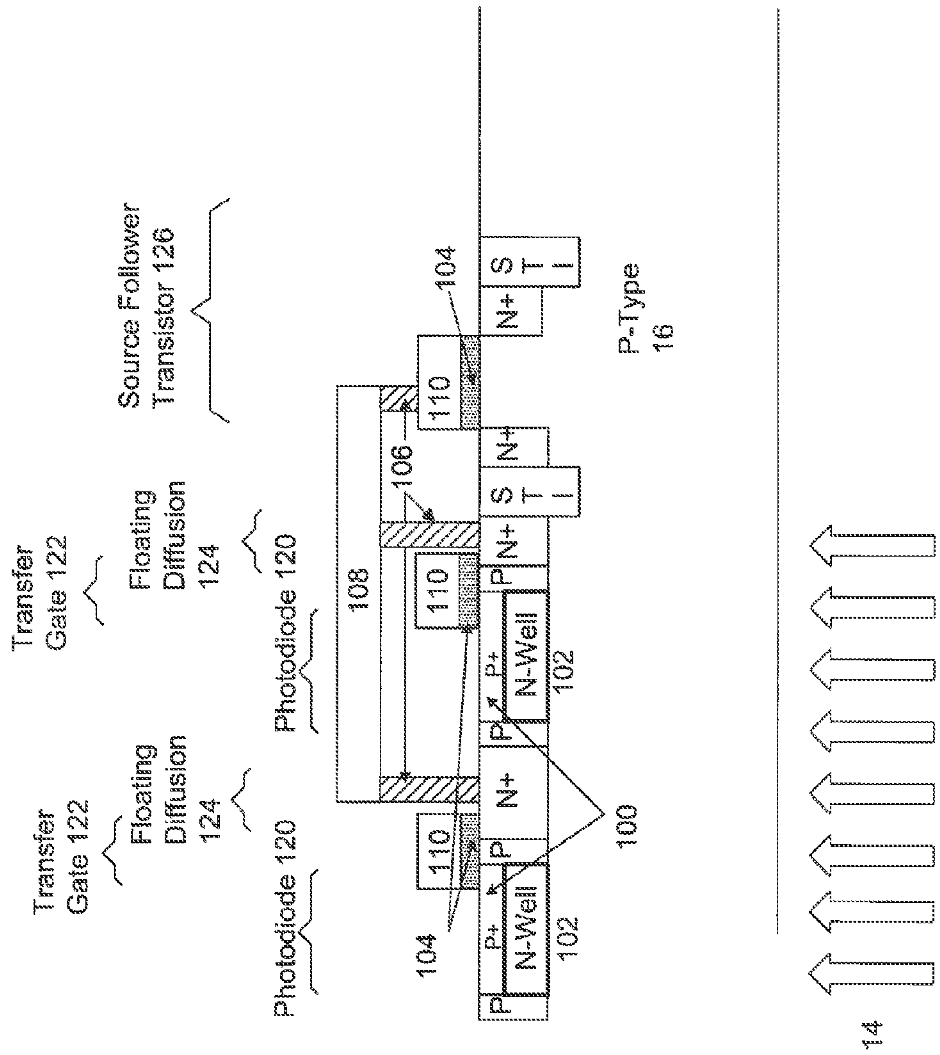
FIG. 11 shows another embodiment of a pixel with two lateral pinned photodiodes and two floating diffusion implants.

FIG. 11 shows a cross-section of one embodiment. In this design, each pinned photodiode has a transfer gate and the floating diffusion is split into two parts, one for each pinned photodiode. The advantage of this is that the photo-generated charge transferred in the same way for each pinned photodiode, transfer gate and floating diffusion.

Each of the pinned photodiodes 120 is formed by an N-well 102 which has a respective pinning layer 100 thereon. On each side of each N-well is a p region. Each pinned photodiode has a respective floating diffusion implant region 124 which is positioned as described in relation to the embodiment of FIG. 1. Likewise the metal layer 108, contacts 106, transfer gates 122 and source follower transistor 126 are positioned in a similar manner to the corresponding elements of FIG. 1. The gates comprise gate oxide 104 on which a polysilicon layer 110 is provided, as with the embodiment of FIG. 1.

Hence, each of the respective elements can have the same doping profile. The doping profile of first pinned photodiode is the same as the doping profile of second pinned photodiode, the doping profile of first transfer gate is the same as the second transfer gate.

Note that the (poly) gate of the transfer gates in embodiments are connected together. This connection may be made in poly or with metal as appropriate. This is a difference to prior art 1.75T pixels where there are 4 photodiodes and 4 transfer gates, but the transfer gates are not connected together and are operated consecutively, e.g. to read out the photodiodes covered with red, green1, blue, green2 colored filters.

Having two floating diffusions may mean that the capacitance of the floating diffusion is increased and so the conversion gain of the floating diffusion is reduced. (The conversion gain is the change in voltage for a change in charge of 1 electron). A reduction in conversion gain will increase the input referred noise of a pixel and so it may be noisier in lower light levels.

$$\#_{e_{noise}} = \frac{(V_{noise} * C_{fd})}{e}$$

At higher light levels, the noise of a pixel is typically dominated by photon shot noise and this noise is the SQRT number of electrons collected. Hence, a higher capacitance floating diffusion allows a greater number of electrons to be collected (full-well capacity) for the same voltage swing and so with a higher number of electrons collected, the signal-noise ratio is improved.

$$SNR_{PSN} = \frac{\#_e}{\sqrt{\#_e}} = \sqrt{\#_e}$$

Figure 12:
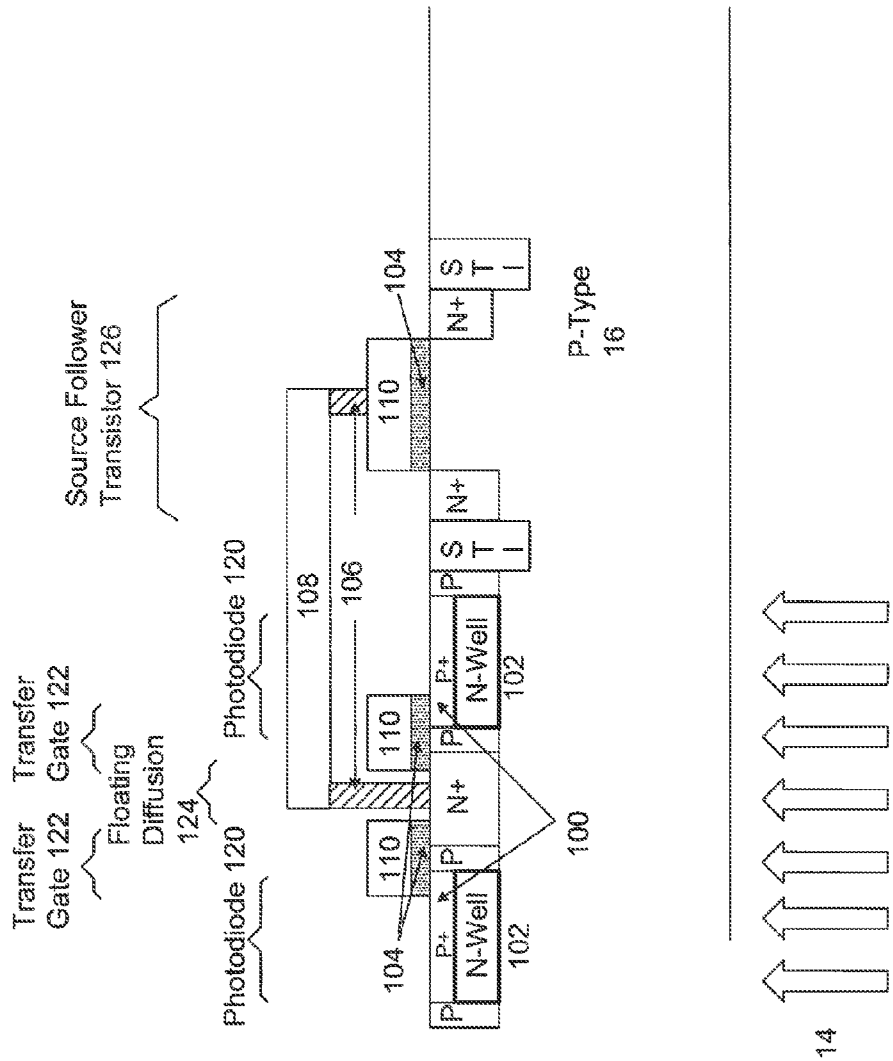
FIG. 12 shows another embodiment of a pixel with two lateral pinned photodiodes and a single floating diffusion implant.

The arrangement of FIG. 12 may be used if the design of pixel is optimized for low light levels and so the floating capacitance is to be reduced. There are two photodiodes 120 and two transfer gates 122, but a common floating diffusion implant 124. This will have an arrangement similar to that of FIG. 5. As photo-generated charge from the photodiodes are now transferred in different directions, different doping profiles for each of the photodiodes and transfer gates may be provided.

Some embodiments may be used for larger pixels by adding more pinned photodiodes, transfer gates and floating diffusions. The floating diffusions may be connected in parallel and also the gates of the transfer gate transistors may also be connected in parallel.

Figure 13:
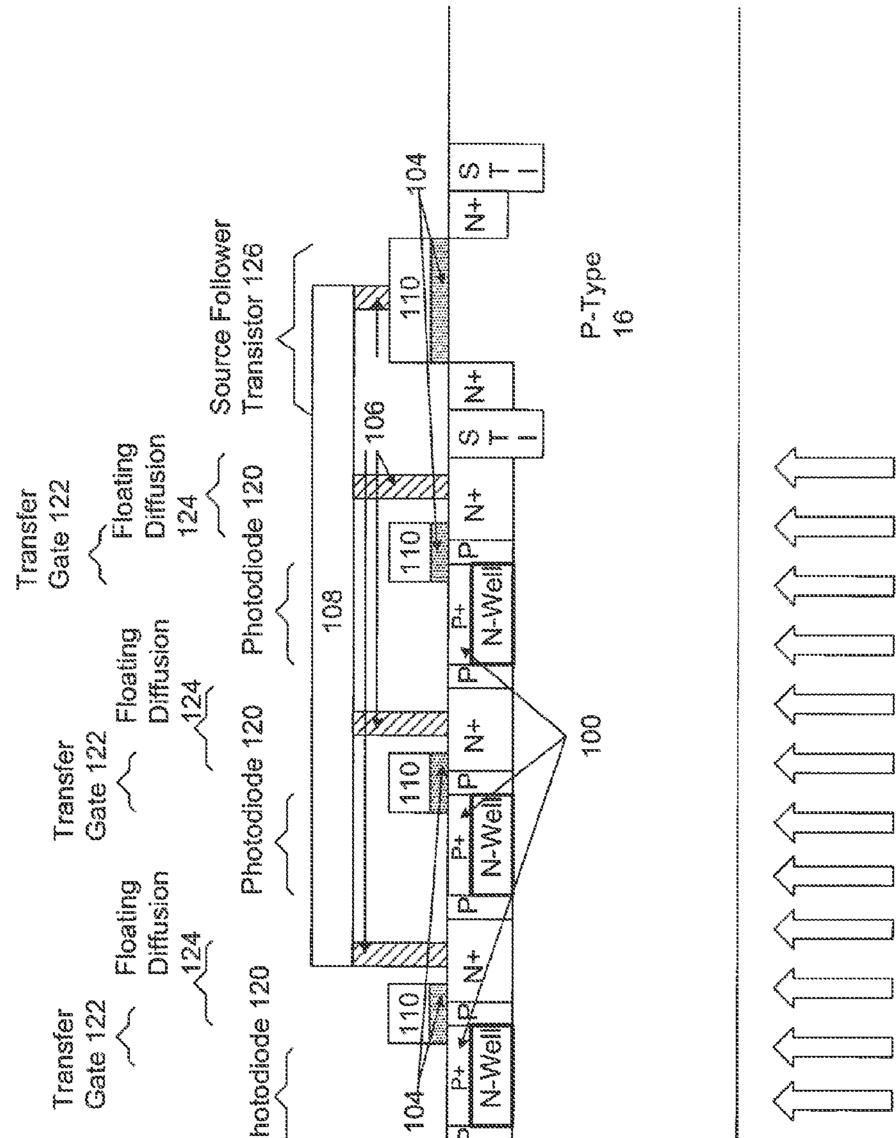
FIG. 13 shows another embodiment of a pixel with three lateral pinned photodiodes and three floating diffusion implants.

FIG. 13 shows a cross section of an embodiment of a pixel which has three lateral pinned photodiodes 120. In this implementation, all the photo-generated charge is transferred in the same direction (left to right in FIG. 13). The arrangement of FIG. 13 is similar to that of FIG. 11 but with an extra lateral pinned photodiode and an extra floating diffusion implant.

Figure 14:
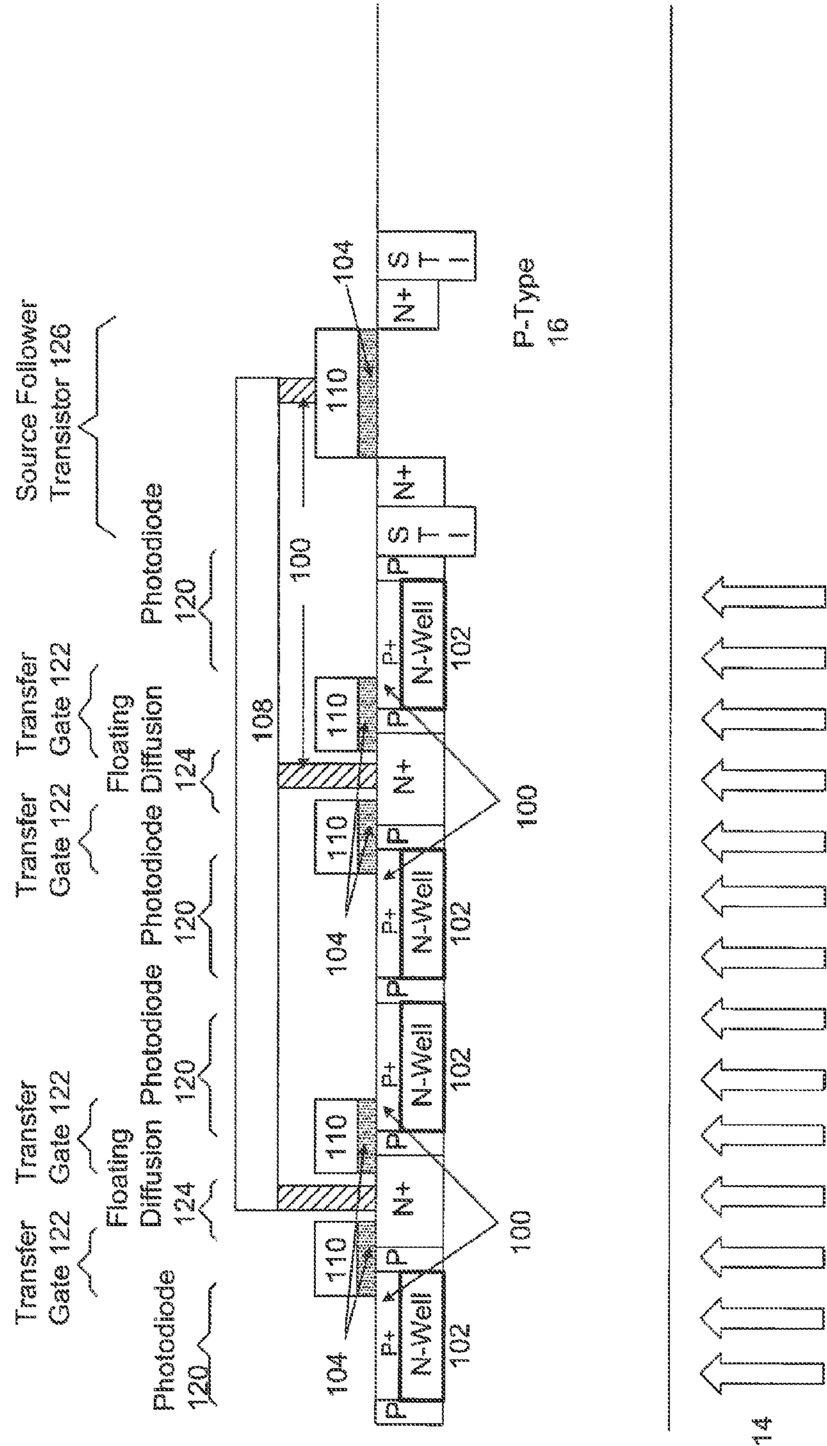
FIG. 14 shows another embodiment of a pixel with four lateral pinned photodiodes and two floating diffusion implants.

If the pixel is even larger and there are four pinned photodiodes implemented, then they can all operate in the same direction (as discuses in relation to FIG. 11 and FIG. 13) or implemented as two pairs with each pair having the photo-generated charge transferred in opposite directions. Such an embodiment is shown in FIG. 14.

Embodiments can be used in any suitable circuit.

FIG. 4 shows the schematic of the embodiments employed in a one example of a pixel. The two pinned photodiodes may be provided with a color filter. The color filter will be same for the plurality of pinned photodiodes of the pixel. For simplicity, only a single color (for example, Green) is shown in FIG. 2. The key point is that the same color filter is used over both pinned photodiodes.

If embodiments are used with microlenses, then a single microlens would illuminate both/all pinned photodiodes in the pixel.

Typically, the array will use pixels covered with either Red or Green or Blue color filters, often arranged in a "Bayer" pattern. However other patterns of color filters are possible.

Some embodiments may have an increased QE and full-well capacity for large photodiodes without increasing the depletion potential. This may produce a pixel which is good at relatively low light levels (as the large area collects a larger number of photons) and/or at relatively high light levels. This may be achieved as the lower depletion potential may give a larger swing and allow for a larger full-well and lower SNR as compared to some prior pixels.

Embodiments have been described which have N-wells. It should be appreciated that other embodiments may be implemented using P-wells. This may be implemented with an N type substrate.

In some embodiments, the distance between two pinned photodiodes of a pixel may be relatively small, for example less than twice the width (x) of the N-well. The distance between the pinned photodiodes is less than the pixel pitch which may be defined for example as the distance between two source-follower transistors.

Embodiments may thus provide a pixel which has more than one pinned photodiode. The extent of a pixel may be defined by deep trench isolation. The deep trench isolation is such that the pinned photodiodes are surrounded. Thus where the pixels are provided in an array, each pixel will be separated from adjacent pixels by its associated deep trench isolation. The deep trench isolation forms a boundary with an adjacent pixel. The deep trench isolation defines an internal region in which the pinned photodiodes of a pixel are provided.

The above described embodiments have been described in relation to MOS transistors. It should be appreciated that in other embodiments, different types of transistors may be used.

Figure 15:
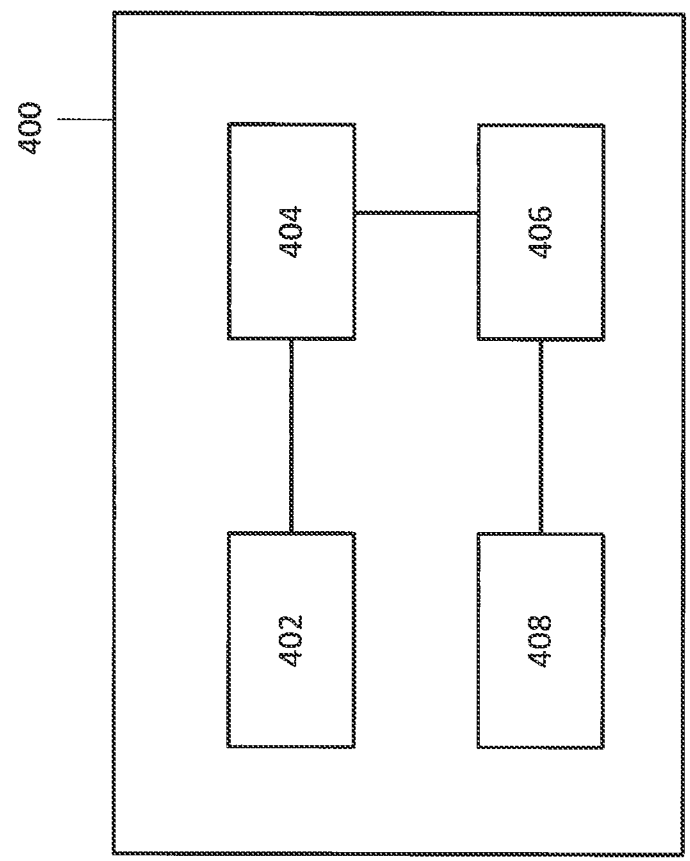
FIG. 15 shows a device having an array of pixels.

Some embodiments may be provided in an electronic device 400 such as shown in FIG. 15. The device 400 may comprise any an array of pixels referenced 402. Each of the pixels of the array may be as previously described. An output from the pixel array may be provided to a processor 404. The output of the processor may control for example a display 406 and allow the captured image to be displayed. Alternatively or additionally the captured image data may be output via an interface 408. The interface may provide an output to another device and/or to a communications link. The communications link may be a radio link, the internet, a wireless local area network, a mobile communications network or any other suitable link.

It should be appreciated that the device may be any suitable device. By way of example only and without limitation, that device may be a mobile telephone, smart phone, tablet, computer, camera or the like.

Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

The invention claimed is:

1. A pixel, comprising:

a plurality of pinned photodiodes, each pinned photodiode formed by a well of a first conductivity type having dimensions in x, y and z directions representing a width, a length and a depth, respectively, located within a substrate of second conductivity type, wherein the depth of the well is larger than at least one of the width or length, each pinned photodiode further including a pinning layer located between a top surface of the substrate and a top of the well, each pinned photodiode being configured to receive incoming light via a surface defined in the x and y directions; and at least one transfer gate configured to transfer charge from the well for each of said plurality of pinned photodiodes to a common sense node, such that charge from said plurality of pinned photodiodes is combined at said common sense node.

2. The pixel as claimed in claim 1, wherein a single transfer gate is provided.

3. The pixel as claimed in claim 1, wherein a respective transfer gate is provided for each pinned photodiode of said plurality of pinned photodiodes.

4. The pixel as claimed in claim 3, wherein each respective transfer gate is configured to be controlled by a common transfer gate signal.

5. The pixel as claimed in claim 1, further comprising a floating diffusion implant for each of said plurality of pinned photodiodes.

6. The pixel as claimed in claim 1, further comprising a single floating diffusion implant for the plurality of pinned photodiodes.

7. The pixel as claimed in claim 1, wherein a floating diffusion implant is provided in a region between two pinned photodiodes of said plurality of pinned photodiodes.

8. The pixel as claimed in claim 1, wherein a floating diffusion implant is provided on one side of one pinned photodiode of said plurality of pinned photodiodes remote from another pinned photodiode of said plurality of pinned photodiodes.

9. The pixel as claimed in claim 1, further comprising a source follower transistor and at least one floating diffusion implant that is provided with a first contact, a gate of said source follower transistor being provided with a second contact, said first and second contacts being in contact with a common metal part.

10. The pixel as claimed in claim 1, wherein a first gate is provided which overlies the plurality of pinned photodiodes and the at least one transfer gate is provided adjacent said first gate.

11. The pixel as claimed in claim 10, wherein in use, during integration, said first gate is at a relatively high voltage and said transfer gate is at a relatively low voltage.

12. The pixel as claimed in claim 1, wherein deep trench isolation is provided around the pixel.

13. The pixel of claim 1, further comprising: at least one processor configured to process said combined charge and produce image data.

14. A pixel system, comprising:

a plurality of pinned photodiodes, each pinned photodiode including a well having dimensions in x, y and z directions representing a width, a length and a depth relative to a substrate respectively, wherein the depth is larger than at least one of the width and or length, each pinned photodiode including a pinning layer extending in the x and y directions, and each pinned photodiode being configured to receive incoming light via a surface defined in the x and y directions; and a transfer gate circuit configured to transfer charge from each well of said plurality of pinned photodiodes to a common sense node in response to a single transfer gate control signal such that charge from the wells of said plurality of pinned photodiodes is combined at said common sense node.

15. The pixel system as claimed in claim 14, wherein the transfer gate circuit includes a single transfer gate electrode shared by the plurality of pinned photodiodes.

16. The pixel system as claimed in claim 14, wherein the transfer gate circuit includes a respective transfer gate electrode for each pinned photodiode, said respective transfer gate electrodes electrically connected to receive said single transfer gate control signal.

17. The pixel system as claimed in claim 14, further comprising a floating diffusion implant for each of said plurality of pinned photodiodes.

18. The pixel system as claimed in claim 14, further comprising a single floating diffusion implant for the plurality of pinned photodiodes.

19. The pixel system as claimed in claim 14, wherein a floating diffusion implant is provided in a region between two pinned photodiodes of said plurality of pinned photodiodes.

20. The pixel system as claimed in claim 14, wherein a floating diffusion implant is provided on one side of one pinned photodiode of said plurality of pinned photodiodes remote from another pinned photodiode of said plurality of pinned photodiodes.

21. The pixel system as claimed in claim 14, further comprising a source follower transistor and at least one floating diffusion implant that is provided with a first contact, a gate of said source follower transistor being provided with a second contact, said first and second contacts being in contact with a common metal part.

22. The pixel system as claimed in claim 14, wherein a first gate is provided which overlies the plurality of pinned photodiodes and the at least one transfer gate is provided adjacent said first gate.

23. The pixel system as claimed in claim 22, wherein in use, during integration, said first gate is at a relatively high voltage and said transfer gate is at a relatively low voltage.

24. The pixel system as claimed in claim 14, wherein deep trench isolation is provided around the pixel.

25. The pixel system of claim 14, further comprising at least one processor configured to process said combined charge and produce image data.

26. A pixel, comprising:

a plurality of pinned photodiodes, each pinned photodiode having dimensions in x, y and z directions representing a width, a length and a depth relative to a substrate respectively, wherein the dimension in the z direction is larger than at least one other dimension in the x or y directions, the pinned photodiode being pinned in one of said x and y directions, each pinned photodiode being configured to receive incoming light via a surface defined in the x and y directions;

at least one transfer gate configured to transfer charge from each of said plurality of pinned photodiodes to a common sense node, such that charge from said plurality of pinned photodiodes is combined at said common sense node; and a source follower transistor and at least one floating diffusion implant that is provided with a first contact, a gate of said source follower transistor being provided with a second contact, said first and second contacts being in contact with a common metal part.

27. The pixel as claimed in claim 26, wherein a single transfer gate is provided.

28. The pixel as claimed in claim 26, wherein a respective transfer gate is provided for each pinned photodiode.

29. The pixel as claimed in claim 28, wherein each respective transfer gate is configured to be controlled by a common transfer gate signal.

30. The pixel as claimed in claim 26, further comprising a floating diffusion implant for each of said plurality of pinned photodiodes.

31. The pixel as claimed in claim 26, further comprising a single floating diffusion implant for the plurality of pinned photodiodes.

32. The pixel as claimed in claim 26, wherein a floating diffusion implant is provided in a region between two pinned photodiodes of said plurality of pinned photodiodes.

33. The pixel as claimed in claim 26, wherein a floating diffusion implant is provided on one side of one pinned photodiode of said plurality of pinned photodiodes remote from another pinned photodiode of said plurality of pinned photodiodes.

34. The pixel as claimed in claim 26, wherein a first gate is provided which overlies the pinned photodiodes and the at least one transfer gate is provided adjacent said first gate.

35. The pixel as claimed in claim 34, wherein in use, during integration, said first gate is at a relatively high voltage and said transfer gate is at a relatively low voltage.

36. The pixel as claimed in claim 26, wherein deep trench isolation is provided around the pixel.

37. The pixel of claim 26, further comprising at least one processor configured to process said combined charge and produce image data.

* * * * *